United States Patent [19]

Kawabe et al.

[11] Patent Number: 5,030,550
[45] Date of Patent: Jul. 9, 1991

[54] DEVELOPER FOR POSITIVE TYPE PHOTORESISTS

[75] Inventors: Yasumasa Kawabe; Hiroshi Matsumoto; Tadayoshi Kokubo, all of Shizuoka, Japan

[73] Assignee: Fuji Photo Film Co., Ltd., Kanagawa, Japan

[21] Appl. No.: 333,928

[22] Filed: Apr. 6, 1989

[30] Foreign Application Priority Data

Apr. 7, 1988 [JP] Japan .................. 63-85773

[51] Int. Cl.$^5$ .......................... G03F 7/30; G03F 7/32
[52] U.S. Cl. ................................ 430/326; 430/331; 252/182.23; 252/182.24; 252/182.27
[58] Field of Search .................. 430/331, 326; 252/182.23, 182.24, 182.27

[56] References Cited

FOREIGN PATENT DOCUMENTS 0043132  1/1982 European Pat. Off. ............ 430/331
60-111246 6/1985 Japan ................................ 430/331
0223120 11/1985 Japan ................................ 430/331

*Primary Examiner*—Cynthia Hamilton
*Attorney, Agent, or Firm*—Sughrue, Mion, Zinn, Macpeak & Seas

[57] ABSTRACT

A positive photoresist developer containing a basic compound and from 10 to 10,000 ppm of a non-ionic surfactant represented by formula (I):

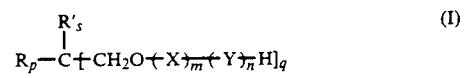

wherein X represents an oxyethylene group; Y represents an oxypropylene group; R represents hydrogen, an alkyl group containing from 1 to 8 carbon atoms, R', or

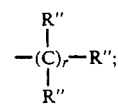

R' represents $-O-(X)_m(Y)_n-H$; R" represents R' of an alkyl group containing l carbon atoms; m and n each is an integer from 1 to 50, provided that m:n is from 20:80 to 80:20; p is 0 or 1, and q and s each is 0 or an integer from 1 to 4, provided that $p+q+s=4$; and l is an integer from 1 to 4; and r is an integer from 1 to 8, provided that $l+r$ is an integer of 9 or more. The developer has superior art in forming properties, and prevents film residues, surface layer peeling, and film reduction.

11 Claims, No Drawings

DEVELOPER FOR POSITIVE TYPE PHOTORESISTS

FIELD OF THE INVENTION

This invention relates to developers for positive type photoresists. More precisely, it concerns developers for positive type photoresists which consist of novolak resins and naphthoquinonediazide based photosensitive materials, and which are useful in the manufacture of semiconductor integrated circuit elements, for example.

BACKGROUND OF THE INVENTION

Remarkable growth has occurred in the electronics industry in recent years and a demand has arisen for resists which can be used lithographically and which have a high resolving power, in view of the increase in the degree of integration of semiconductor devices and the improvement in fine working techniques which have accompanied this growth.

Hence, there has been a shift away from the negative type resists towards the positive type resists which have superior resolving power.

Compositions which contain an alkali soluble resin and a naphthoquinonediazide compound as a photosensitive material are generally used for positive-type photo-resist compositions. For example, "Novolak type phenolic resin/naphthoquinonediazide substituted compounds" have been disclosed in U.S. Pat. Nos. 3,666,473, 4,115,128 and 4,173, 470, and examples of a novolak resin made from cresols and formaldehyde/-trihydroxybenzophenone-1, 2- naphtho-quinonediazide-sulfonate esters have been described as very typical compositions by L. F. Thompson in "Introduction to Microlithograhy" (ASC publication, No. 219, pages 112–121).

The novolak resins used as binding agents do not swell and can be dissolved in an aqueous alkali solution, and when the image which has been formed is used as an etching mask it is highly resistant to plasma etching in particular and is consequently very useful in this application. Furthermore, the naphthoquinonediazide compounds which are used as photosensitive materials are used as dissolution inhibitors which reduce the alkali solubility of the novolak resins themselves. They function specifically by increasing the alkali solubility of the novolak resin rather than by producing an alkali soluble substance when they are irradiated with light and broken down, and they are especially useful for positive type photoresists because they undergo a major change in properties when irradiated with light.

Many of the positive type photoresists developed and practically used in the past have contained novolak resins and naphthoquinonediazide based photosensitive materials for this reason.

The developers for these naphthoquinonediahide based positive photoresists normally are an aqueous alkali solution, but if an aqueous alkali solution which contains metal ions is used as a developer, such as in the manufacture of semiconductor elements, this can have an adverse effect on the characteristics of the product. Alkalis which do not contain metal ions, such as quaternary amine hydroxides, e.g., tetramethylammonium hydroxide or trimethyl (2-hydroxyethyl) ammonium hydroxide, are used.

However, puddle development systems are generally used for development in the manufacture of integrated circuits and the wetting properties of the developer are important in such a system. Moreover, in recent years, the degree of integration of integrated circuits has also increased and the wetting properties of the developer have become increasingly important as the wafer size has increased.

However, the wetting properties of developers which do not contain surfactants are poor and sometimes the exposed parts of the resist which should be removed by development are not removed satisfactorily and a slight residue (referred to below as a film residue) is left behind. On other occasions the surface layer of the fine resist pattern in the unexposed parts peels away (referred to below as surface layer peeling) and this surface layer becomes attached to the exposed parts so that development failure occurs.

Furthermore, the technique of adding surfactants to developers to improve their wetting properties is well known, and disclosures in this connection have been made, for example, in JP-A-58-57128, JP-A-60-223120 and JP-A-61-167948 and U.S. Pat. No. 4,576,903. (The term "JP-A" used therein means an "unexamined published Japanese patent application".) However, foaming is liable to occur with developers which contain known conventional surfactants and the bubbles sometimes cause development failure. Moreover, in many cases the temperature dependence is considerable when such developers are used and this has an adverse effect on the photographic speed of the resist. Moreover, few of these materials have an adequate effect in preventing the occurrence of film residues and surface layer peeling. Even when they are effective in respect of foaming, film residues and surface peeling, the extent by which the film is thinned in the unexposed part is sometimes large with an adverse effect on dimensional accuracy, or the cross sectional form of the resist may become trapezoidal with a resulting loss of resolution.

One method of improving the anti-foaming properties involves adding a hydrophilic organic solvent to the developer as suggested, for example, in JP-A-49-91177, JP-A-60-158461, JP-A-60-241051 and JP-A-61-232453 and U.S. Pat. No. 4,741,989, but the addition of small amounts has no effect on the anti-foaming properties or the occurrence of film residue and surface layer peeling. When large amounts are added, the extent of film reduction in the unexposed parts may be increased and there are problems with dimensional accuracy.

Moreover, even when the conventional surfactants and organic solvents are used conjointly this is not satisfactory with respect to all factors, including anti-foaming properties, the occurrence of film residues and surface layer peeling, and the prevention of film reduction.

Furthermore, the addition of non-ionic surfactants of the type obtained by the polyoxyethylene condensation of trihydric or higher alcohols has been suggested in JP-A-62-175738, but even these are ineffective with respect to anti-foaming properties.

SUMMARY OF THE INVENTION

As a result of thorough investigation, the inventors have discovered that the aforementioned problems can be solved by adding specific surfactants to conventional positive type photoresist developers, and the present invention is based upon this discovery.

One object of the present invention is to provide a developer for positive type photoresists to produce resist patterns without the occurrence of foaming, film residues and surface layer peeling during the development.

Another object of the present invention is to provide a developer for positive type photoresists to provide resist patterns with a high sensitivity and without a film reduction in the unexposed parts. Thus, these and other objects of the invention can be attained by a positive photoresist developer containing a basic compound and from 10 to 10,000 ppm of a non-ionic surfactant represented by formula (1):

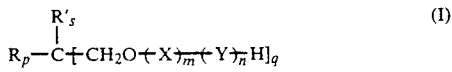

wherein X represents an oxyethylene group; Y represents an oxypropylene group; R represents hydrogen, an alkyl group containing from 1 to 8 carbon atoms, R',

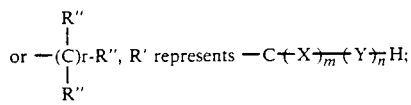

R" represents R' or an alkyl group containing 1 carbon atoms wherein R"s bonding to the carbon atom may be the same or different; m and n each is an integers from 1 to 50, provided that m:n is from 20:80 to 80:20; p is 0 or 1, and q and s each is 0 or an integer from 1 to 4, provided that $p+q+s=4$; and l is an integer from 1 to 4, and r is an integer from 1 to 8; provided that $l+r$ is an integer of 9 or more.

DETAILED DESCRIPTION OF THE INVENTION

The invention is described in detail below.

When, in the definitions indicated above, the value of $l+r$ is an integer of 8 or less, an alkyl group having from 1 to 8 carbon atoms is defined twice in the definition of R, both as an alkyl group having from 1 to 8 carbon atoms and as a group $CR''R''_rR''$.

The developers in which a basic substance forms the principal component in this invention are aqueous solution of inorganic alkalis, such as sodium hydroxide, potassium hydroxide, sodium carbonate, sodium silicate, sodium phosphate, sodium metasilicate or aqueous ammonia, or alkalis such as primary amines (for example ethylamine, n-propylamine), secondary amines (for example diethylamine, di-n-butylamine), tertiary amines (for example triethylamine, methyldiethylamine), alcoholamines (for example diethylethanolamine, triethanolamine), amides (for example formamide, acetamide), quaternary ammonium salts (for example tetramethylammonium hydroxide, trimethyl(2-hydroxyethyl)ammonium hydroxide, tetraethylammonium hydroxide, tributylmethylammonium hydroxide, tetraethanolammonium hydroxide, emthyltriethanolammonium hydroxide, benzylmethyldiethanolammonium hydroxide, benzyldimethylethanolammonium hydroxide, benzyltriethanolammonium hydroxide, tetrapropylammonium hydroxide, tetrabutyl ammonium hydroxide) or cyclic amines (for example pyrrole, piperidine).

The use of aqueous solutions of quaternary ammonium salts or cyclic amines is preferred, and the use of tetramethylammonium hydroxide and trimethyl(2-hydroxyethyl)ammonium hydroxide is especially desirable in cases where problems can arise when developers containing metals are used.

These may be used individually or combinations of two or more types may be used. Furthermore, the concentration of these substances is within the range from 1 to 10 wt.%, and preferably within the range from 1.5 to 5.5 wt.%.

The non-ionic surfactants of this invention which are added to the positive type photoresist developers are trihydric or tetrahydric alcohol polyoxyalkylene condensate type non-ionic surfactants consisting of a polyoxyethylenepolyoxypropylene alkyl ether, and the proportions of polyoxyethylene and polyoxypropylene therein is especially important. There is no antiforming effect with just a polyoxyethylene component and the effect against film residues and surface layer peeling is inadequate with just a polyoxypropylene component. In order to realize the aims of this invention the proportions used must be within the range from 20 : 80 to 80 : 20, bore preferably from 25:75 to 75:25 and most preferably from 30:70 to 70:30. The molecular weight of the non-ionic surfactant is preferably from 1000 to 8000 and more preferably from 1500 to 5000.

Thus, film residues and surface layer peeling are liable to occur if the polyoxyethylene content is less than 20%, and when the polyoxyethylene content exceeds 80 %, the extent of film reduction in the unexposed parts increases and there is a loss of antifoaming properties.

Furthermore, the number of polyethylene groups and the number of polypropyline groups are each preferably not more than 50, and if the numbers exceed 50 the molecular weight becomes excessively high and this in impractical.

Examples of trihydric or tetrahydric alcohol polyoxyalkylene condensate non-ionic surfactants include polyoxyalkylene condensates of 1,1,1-ethanetriol, 1,1,1-propanetriol, 1,2,3-propanetriol, 1,2,3-butanetriol, 1,2,4-butanetriol, 1,3,3-butanetriol, 1,2,3-pentanetriol, 1,2,5-pentanetriol, 1,3,4-pentanetriol, 1,3,5-pentanetriol, 2,3,4-pentanetriol, trimethylolethane, 1,2,3-hexanetriol, 1,2,6-hexanetriol, 1,3,5-hexanetriol, 2,3,4-hexanetriol, 2,3,5-hexanetriol, trimethylolpropane, 1,2,3-heptanetriol, 1,3,7-heptanetriol, 1,4,5-heptanetriol, 1,4,7-heptanetriol, 2,3,4-heptanetriol, threitol, erythritol, pentaerythritol, 1,2,3,4-hexanetetrol, 1,2,5,6-hexanetetrol, 1,2,4,6-hexanetetrol and 2,3,4,5-hexanetetrol.

The amount of the surfactant of this invention added is preferably within the range from 10 to 10,000 ppm (weight parts per million), and most desirably within the range from 100 to 5,000 ppm. These surfactants can be added individually or in any combination.

The additives which are normally used in conventional developers can be used individually or in any combination in the developers of this invention. For example, cationic surfactants or other non-ionic surfactants may be used conjointly in order to improve the dissolution selectivity of the exposed and unexposed parts of the positive type photoresist film, and the aforementioned surfactants, hydrophilic solvents and antifoaming agents can be combined in order to prevent the occurrence of film residues, surface layer peeling and foaming.

Quaternary ammonium salts, pyridinium salts and picolinium salts are used in the main as cationic surfactants, and examples include quaternary ammonium salts such as trimethylcocoanotammonium chloride, methylbis(2-hydroxyethyl)cocoanutammonium chloride, tributylmethylammonium chloride, triamylmethylammonium chloride, trihexylmethylammonium chloride, trimethylhexadecylammonium chloride, trimethylcoaoanutammunium chloride, and trimethyldodecylammonium chloride.

Pyridinium salts include dodecylpyridinium chloride for example and picolinium salts include dedecylpicolinium chloride for example. Examples of non-ionic surfactants include polyoxyethylene alkyl ethers (for example polyoxyethylene lauryl ether, polyoxyethylene cetyl ether, polyoxyethylene oleyl ether), polyoxyethylene alkylaryl ethers (for example polyoxyethylene octylphenyl ether, polyoxyethylene nonylphenyl ether), polyoxyethylene/ polyoxypropylene block copolymers, sorbitane fatty acid esters (for example sorbitane monolaurate, sorbitane monopalmitate, sorbitane monostearate, sorbitane mono-oleate, sorbitane trioleate, sorbitane tristearate), and polyoxyethylenesorbitane fatty acid esters (for example polyoxyethylenesorbitane monolaurate, polyoxyethylenesorbitane monopalmitate, polyoxyethylenesorbitane monostearate, polyoxyethylenesorbitane trioleate, polyoxyethylenesorbitane tristearate).

Examples of hydrophilic organic solvents include monohydric alcohols (for example methanol, ethanol, n-propanol, iso-propanol, sec-butanol, tert-butanol, n-amyl alcohol, iso-amyl alcohol, active amyl alcohol, sec-amyl alcohol, 3 -pentanol, tert-amyl alcohol), ketones (for example acetone, methyl ethyl ketone, diethyl ketone, methyl iso-butyl ketone, cyclohexanone), cyclic ethers (for example tetrahydrofuran, dioxane, trimethylene oxide, butylene oxide), acetic acid esters (for example ethyl acetate, butyl acetate), glycol alkyl ethers (for example ethyleneglycol monomethyl ether, ethyleneglycol monoethyl ether, ethyleneglycol monoiso-propyl ether, propyleneglycol monomethyl ether, propyleneglycol monoethyl ether, diethyleneglycol dimethyl ether), cellosolve esters (for example methylcellosolve acetate, ethylcellosolve acetate) and monooxycarboxylic acid esters (for example methyl lactate, ethyl lactate).

These conventional additives can be added in total at a rate within the range of from 1 to 30 wt.%, and preferably at a rate within the range of from 1 to 5 wt.%, based on the amount of the surfactant of this invention.

Furthermore, additives for accelerating the dissolution of positive type photoresist compositions in the developer can be added to the developers of this invention. These additives include polyhydroxy compounds, and the preferred polyhydroxy compounds are phenols, resorcinol, phloroglucinol, phloroglucide, 2,3,4-trihydroxybenzophenone, 2,3,4,4'-tetrahydroxybenzophenone, acetone pyrogallol condensate resins and novolak resins.

The amount of the polyhydroxy compound added can be selected appropriately by those of ordinary skill in the industry, but is preferably about at most 10 wt% based on the amount of the developer.

The developers of this invention provide resist patterns without the occurrence of surface layer peeling or film residues during the development of a positive type photoresist, and with a high residual film factor. Furthermore, the developers of this invention have good resist wetting properties and there is no wastage of developer. Since the permeation properties are good, good development can be achieved even in cases where very fine patterns are being formed and it is possible to obtain distinct resist patterns.

Moreover, the developers of this invention have excellent anti-foaming properties and are not subject to development failure.

EXAMPLES

The invention is now described in greater detail with reference to the following examples, but the invention is not to be construed as being limited thereto. Unless otherwise indicated, all parts, percents and ratios are by weight.

EXAMPLES 1 TO 4 AND COMPARATIVE EXAMPLES 1 TO 4

Forty grams of m-cresol, 60 grams of p-cresol, 49 grams of 37% aqueous formalin solution and 0.13 gram of oxalic acid were introduced into a three necked flask, heated to 100° C. with stirring, and reacted for 15 hours.

The temperature was then raised to 200° C., the pressure was reduced gradually to 5 mm.Hg and the water and unreacted monomers, formaldehyde and oxalic acid were removed. The molten, alkali soluble, novolak resin was cooled to room temperature and recovered. The weight average molecular weight of the novolak resin obtained (polystyrene calculation) was 7,100.

Next, 1.25 grams of the 1,2-naphthoquinonediazido-5-sulfonic acid ester of 2,3,4,4'-tetrahydroxybenzophenone was added as a photosensitizer to 5 grams of this novolak resin and the mixture was dissolved in 15 grams of ethylcellosolve acetate and filtered using a 0.2 $\mu$m microfilter to provide a photoresist composition. This photoresist composition was coated onto a 4 inch silicon wafer using a spinner and dried for 30 minutes at 90° C. under a blanket of nitrogen in an oven, whereupon a resist film of thickness 1.5 $\mu$m was obtained. This film was exposed to light using a reaction projection exposing apparatus (NSR1505G, made by the Nikon Co.) and then it was puddle developed for 1 minute at 23° C. using developers prepared by adding the non-ionic surfactants shown in table 1 to an aqueous solution containing 2.38% of tetramethylammonium hydroxide, rinsed with water for 30 seconds and dried.

The resist patterns on the silicon wafers so obtained were examined using a scanning electron microscope and the speed(sensitibity), resolution, developing parties (surface layer peeling, film residues) and the film retention factor were measured. The results obtained were as shown in table 2.

Furthermore, the results obtained in comparative examples in which non-ionic surfactants other than those of this invention shown in table 1 were added or in which no surfactant was added are also shown in table 2.

The speed is defined as the reciprocal of the exposure required to realize a 2.0 $\mu$m mask pattern, and the values are given as relative values with respect to the speed obtained in comparative example 1.

The residual film factor is indicated in terms of the ratio of the unexposed parts before and after development expressed as a percentage.

In respect of surface layer peeling and film residues, a good result, where the phenomena did not occur, is indicated by ○, a case in which the phenomena occurred extensively is indicated by X, and those cases where the phenomena occurred to a slight extent are indicated by Δ.

Wetting properties are indicated by ○ where there was no wetting residue and by X when a wetting residue was formed.

The amount of developer used was 13 cc to a silicon wafer having 4 inch diameter.

In connection anti-forming properties, ○ signifies that no bubbles were formed in the developer and X signifies that bubbles were formed.

It is clear from table 2 that the developers of this invention provided excellent speeds and residual film factors, did not give rise to surface layer peeling and film residues, and had excellent wetting properties and anti-foaming properties.

TABLE 1

|   | Non-ionic Surfactant | | Amount Added |
|---|---|---|---|
|   | Type | EP/PO*[1] | ppm |
|   | THIS INVENTION | | |
| 1 | Polyoxyethylene/polyoxypropylene trimethylolpropane trisether $CH_3CH_2C\{CH_2O\{CH_2CH_2O\}_m\{CH_2CH(CH_3)O\}_n H]_3$ | 25/75 | 500 |
| 2 | Polyoxyethylene/polyoxypropylene trimethylolethane trisether $CH_3C\{CH_2O\{CH_2CH_2O\}_m\{CH_2CH(CH_3)O\}_n H]_3$ | 50/50 | 300 |
| 3 | Polyoxyethylene/polyoxypropylene hexane trisether $CH_2O\{CH_2CH_2O\}_m\{CH_2CH(CH_3)O\}_n H$ $HC-O\{CH_2CH_2O\}_m\{CH_2CH(CH_3)O\}_n H$ $(CH_2)_4O\{CH_2CH_2O\}_m\{CH_2CH(CH_3)O\}_n H$ | 50/50 | 1000 |
| 4 | Polyoxyethylene/polyoxypropylene pentaerythritol tetra-ether $C\{CH_2O\{CH_2CH_2O\}_m\{CH_2CH(CH_3)O\}_n H]_4$ | 40/60 | 500 |
|   | COMPARATIVE EXAMPLES | | |
| 1 | None | — | — |
| 2 | Polyoxyethylene nonylphenyl ether | 100/0 | 1000 |
| 3 | Polyoxyethylene/polyoxypropylene block copolymer | 25/75 | 500 |
| 4 | Polyoxyethylene/polyoxypropylene trimethylol propane trisether | 90/10 | 500 |

*Proportions of ethylene oxide and propylene oxide.

TABLE 2

|   | Relative Speed | Residual Film Factor (%) | Surface Layer Peeling | Film Residue | Wetting Properties | Anti-foaming Properties |
|---|---|---|---|---|---|---|
| THIS INVENTION | | | | | | |
| 1 | 0.9 | 99 | ○ | ○ | ○ | ○ |
| 2 | 0.9 | 99 | ○ | ○ | ○ | ○ |
| 3 | 0.9 | 98 | ○ | ○ | ○ | ○ |
| 4 | 0.9 | 99 | ○ | ○ | ○ | ○ |
| COMPARATIVE EXAMPLES | | | | | | |
| 1 | 1.0 | 99 | X | X | X | ○ |
| 2 | 0.9 | 92 | ○ | ○ | ○ | X |
| 3 | 0.9 | 96 | ○ | △ | ○ | X |
| 4 | 0.9 | 94 | ○ | ○ | ○ | X |

While the invention has been described in detail and with reference to specific embodiments thereof, it will be apparent to one skilled in the art that various changes and modifications can be made therein without departing from the spirit and scope thereof.

What is claimed is:

1. A positive photoresist developer comprising a basic compound and from 10 to 10,000 ppm of a non-ionic surfactant represented by formula (I):

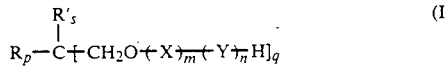

wherein X represents an oxyethylene group; Y represents an oxypropylene group; R represents hydrogen, an alkyl group containing from 1 to 8 carbon atoms, R', or

R' represents $-O\{X\}_m\{Y\}_n H$; R" represents R' or an alkyl group containing 1 carbon atoms; m and n each is an integer from 1 to 50, provided that m:n is from 20:80 to 80:20; p is 0 or 1, and q and s each is 0 or an integer of 1 to 4, provided that p+q+s=4; and l is an integer from 1 to 4, and r is an integer from 1 to 8; provided that l+r is an integer of 9 or more.

2. The developer as claimed in claim 1, wherein said basic compound is selected from an inorganic alkali, a primary amine, a secondary amine, a tertiary amine, an alcohol amine, an amide, a quaternary ammonium salt, and a cyclic amine.

3. The developer as claimed in claim 2, wherein said basic compound is a quaternary ammonium salt or a cyclic amine.

4. The developer as claimed in claim 3, wherein said basic compound is tetramethylammonium hydroxide or trimethyl(2-hydroxyethyl)ammonium hydroxide.

5. The developer as claimed in claim 1, wherein said developer is an aqueous developer solution containing said basic compound in an amount of 1 to 10 weight %.

6. The developer as claimed in claim 5, wherein said basic compound is present in an amount of 1.5 to 5.5 weight of said aqueous developer solution.

7. The developer as claimed in claim 1, wherein m:n is from 30:70 to 70:30.

8. The developer as claimed in claim 1, wherein said non-ionic surfactant is a polyoxyalkylene condensate of 1,1,1-ethanetriol, 1,1,1-propanetriol, 1,2,3-propanetriol, 1,2,3-butanetriol, 1,2,4-butanetriol, 1,3,3-butanetriol, 1,2,3-pentanetriol, 1,2,5-pentanetriol, 1,3,4-pentanetriol, 1,3,5-pentanetriol, 2,3,4-pentanetriol, trimethylolethane, 1,2,3-hexanetriol, 1,2,6-hexanetriol, 1,3,5-hexanetriol, 2,3,4-hexanetriol, 2,3,5-hexanetriol, trimethylolpropane, 1,2,3-heptanetriol, 1,3,7-heptanetriol, 1,4,5-heptanetriol, 1,4,7-heptanetriol, 2,3,4-heptanetriol, threitol, erythritol, pentaerythritol, 1,2,3,4-hexanetetrol, 1,2,5,6-hexanetetrol, 1,3,4,6-hexanetetrol or 2,3,4,5-hexanetetrol.

9. The developer as claimed in claim 1, wherein said non-ionic surfactant is present in an mount of from 100 to 5,000 ppm.

10. The developer as claimed in claim 1, further comprising from 1 to 30 weight % of a cationic surfactant, a second non-ionic surfactant, a hydrophilic solvent, or an anti-foaming agent based on the amount of said non-ionic surfactant represented by formula (I).

11. A method for developing a positive photoresist comprising the steps of:

(a) imagewise exposing a positive photoresist layer; and (b) developing said exposed photoresist with a positive photoresist developer comprising a basic compound and from 10 to 10,000 ppm of a non-ionic surfactant represented by formula (I):

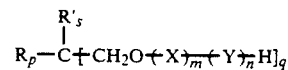

wherein X represents an oxyethylene group; Y represents an oxypropylene group; R represents hydrogen, an alkyl group containing from 1 to 8 carbon atoms, R', or

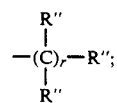

R' represents $-O(X)_m(Y)_n H$; R'' represents R' or an alkyl group containing 1 carbon atoms; m and n each is an integer from 1 to 50, provided that m:n is from 20:80 to 80:20; p is 0 or 1; q and s each is 0 or an integer of 1 to 4; provided that $p+q+s=4$; and l is an integer from 1 to 4, and r is an integer from 1 to 8, provided that $l+r$ is an integer of 9 or more;

to form a positive pattern in said photoresist corresponding to said image.

* * * * *